United States Patent
Lin et al.

(10) Patent No.: US 11,061,764 B2
(45) Date of Patent: Jul. 13, 2021

(54) DATA STORAGE DEVICE AND DATA RETRIEVAL METHOD

(71) Applicant: Silicon Motion, Inc., Jhubei (TW)

(72) Inventors: Chin-Chi Lin, New Taipei (TW); Kun-Lin Ho, Taichung (TW)

(73) Assignee: Silicon Motion, Inc., Jhubei (TW)

( * ) Notice: Subject to any disclaimer, the term of this patent is extended or adjusted under 35 U.S.C. 154(b) by 870 days.

(21) Appl. No.: 14/951,052

(22) Filed: Nov. 24, 2015

(65) Prior Publication Data

US 2016/0239227 A1    Aug. 18, 2016

(30) Foreign Application Priority Data

Feb. 12, 2015 (TW) ................. 10410467.5

(51) Int. Cl.
*G06F 11/00* (2006.01)
*G06F 11/10* (2006.01)
*G11B 20/18* (2006.01)
*G11C 29/04* (2006.01)

(52) U.S. Cl.
CPC ........ *G06F 11/1068* (2013.01); *G06F 11/106* (2013.01); *G06F 11/1008* (2013.01); *G06F 11/1076* (2013.01); *G11B 20/1833* (2013.01); *G06F 11/1056* (2013.01); *G11C 2029/0411* (2013.01)

(58) Field of Classification Search
CPC .. G06F 11/1068; G06F 3/0619; G06F 3/0688; G06F 3/064
USPC .......................................... 714/763, 764, 773
See application file for complete search history.

(56) References Cited

U.S. PATENT DOCUMENTS

| 8,788,910 | B1* | 7/2014 | Northcott | G06F 11/1012 714/763 |
| 2008/0163031 | A1* | 7/2008 | Hsieh | G06F 11/1068 714/773 |
| 2008/0198650 | A1* | 8/2008 | Shalvi | G11C 16/26 365/185.02 |
| 2010/0241914 | A1* | 9/2010 | Chen | G11C 29/16 714/718 |

(Continued)

FOREIGN PATENT DOCUMENTS

| CN | 103827833 A | 5/2014 |
| CN | 103914396 A | 7/2014 |

(Continued)

OTHER PUBLICATIONS

Office Action of related TW application, published on Apr. 26, 2016.

(Continued)

*Primary Examiner* — Albert Decady
*Assistant Examiner* — Osman M Alshack
(74) *Attorney, Agent, or Firm* — Wang Law Firm, Inc.

(57) ABSTRACT

A data storage device includes a flash memory and a controller. The flash memory includes a plurality of dies, and each of the dies includes a first memory plane and a second memory plane, wherein each of the first memory plane and the second memory plane includes a plurality of physical pages. The controller retrieves data of a first physical page of the first memory plane and data of a second physical page of the second memory plane in response to a read command which is arranged to read a target page.

12 Claims, 7 Drawing Sheets

(56) References Cited

U.S. PATENT DOCUMENTS

| | | | |
|---|---|---|---|
| 2011/0289254 A1* | 11/2011 | Roohparvar | G11C 5/066 710/316 |
| 2012/0317365 A1* | 12/2012 | Elhamias | G06F 12/0862 711/141 |
| 2014/0157087 A1* | 6/2014 | Yurzola | G06F 11/1068 714/773 |
| 2015/0317210 A1* | 11/2015 | Palmer | G06F 11/1441 714/6.3 |
| 2015/0363264 A1* | 12/2015 | Cai | G06F 11/1068 714/6.11 |

FOREIGN PATENT DOCUMENTS

| | | |
|---|---|---|
| TW | 201003669 A | 1/2010 |
| TW | 201428757 A | 7/2014 |

OTHER PUBLICATIONS

Office Action of corresponding CN application, dated Aug. 2, 2018.

* cited by examiner

DATA STORAGE DEVICE AND DATA RETRIEVAL METHOD

CROSS REFERENCE TO RELATED APPLICATIONS

This Application claims priority of Taiwan Patent Application No. 104104675, filed on Feb. 12, 2015, the entirety of which is incorporated by reference herein.

BACKGROUND OF THE INVENTION

1. Field of the Invention

The present invention relates to a data-storage device, and in particular to a data-storage device capable of simultaneously accessing pages in different memory planes.

2. Description of the Related Art

Flash memory is considered a non-volatile data-storage device, using electrical methods to erase and program itself. NAND Flash, for example, is often used in memory cards, USB flash devices, solid state devices, eMMCs, and other memory devices.

In the production process of flash memories, all of the memory cells (pages) of a column of a flash memory might not be successfully accessed due to issues with dust or masks. Traditionally, the number of bad columns may be detected by scanning the flash memory. However, the ability of error correction will be affected when there are too many numbers of bad columns.

BRIEF SUMMARY OF THE INVENTION

A detailed description is given in the following embodiments with reference to the accompanying drawings.

The present invention provides a data storage device. The data storage device includes a flash memory and a controller. The flash memory includes a plurality of dies, and each of the dies includes a first memory plane and a second memory plane, wherein each of the first memory plane and the second memory plane includes a plurality of physical pages. The controller retrieves data of a first physical page of the first memory plane and data of a second physical page of the second memory plane in response to a read command which is arranged to read a target page.

The present invention further provides a data retrieval method applied to a flash memory, wherein the flash memory includes a plurality of dies, each of the dies includes a first memory plane and a second memory plane, each of the first memory plane and the second memory plane includes a plurality of physical pages. The data retrieval method includes: receiving a read command from a host, wherein the read command is arranged to read a target page; and retrieving data of a first physical page of the first memory plane and data of a second physical page of the second memory plane in response to the read command.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
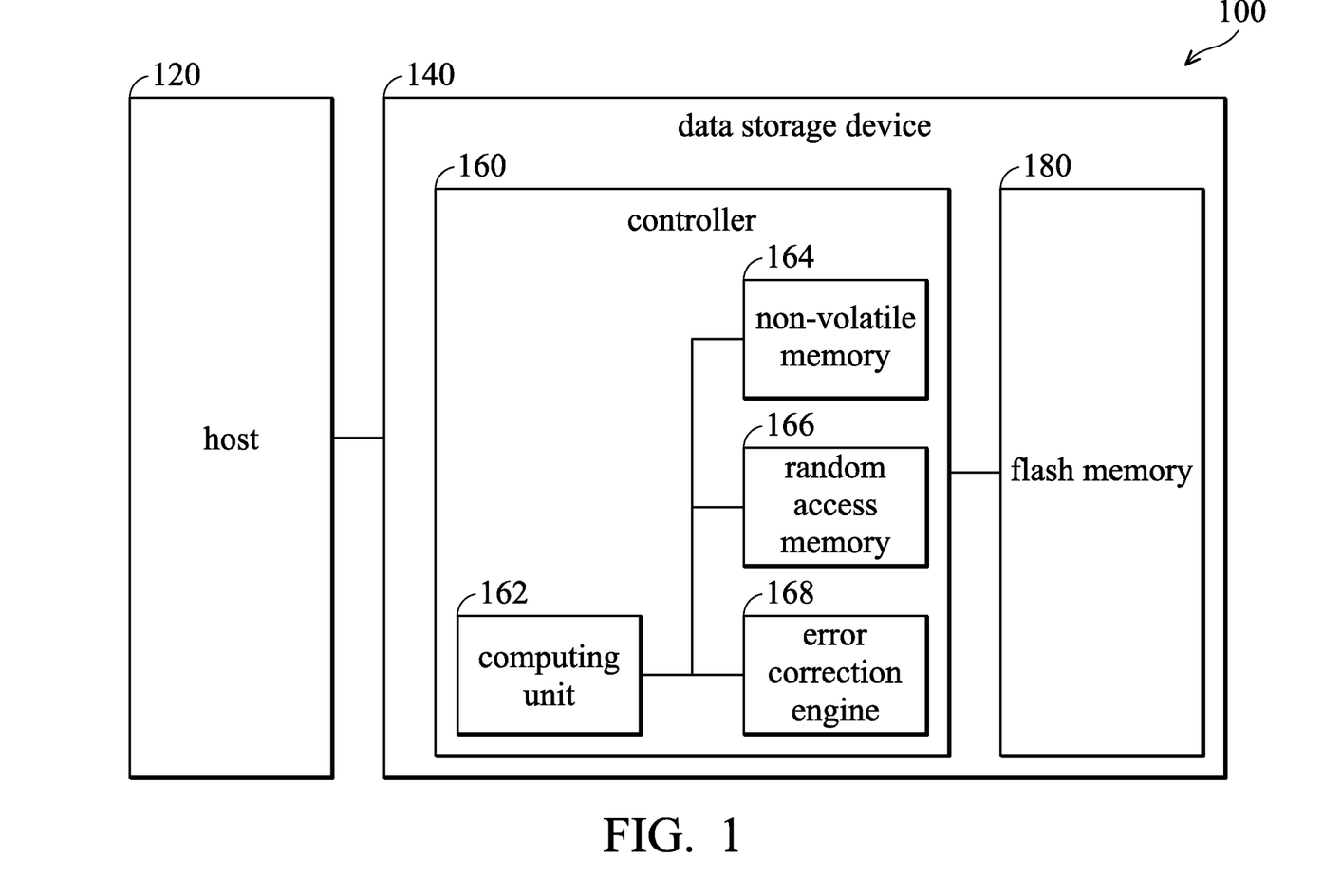
FIG. 1 is a schematic diagram illustrating an embodiment of an electronic system of the present invention.
Figure 2:
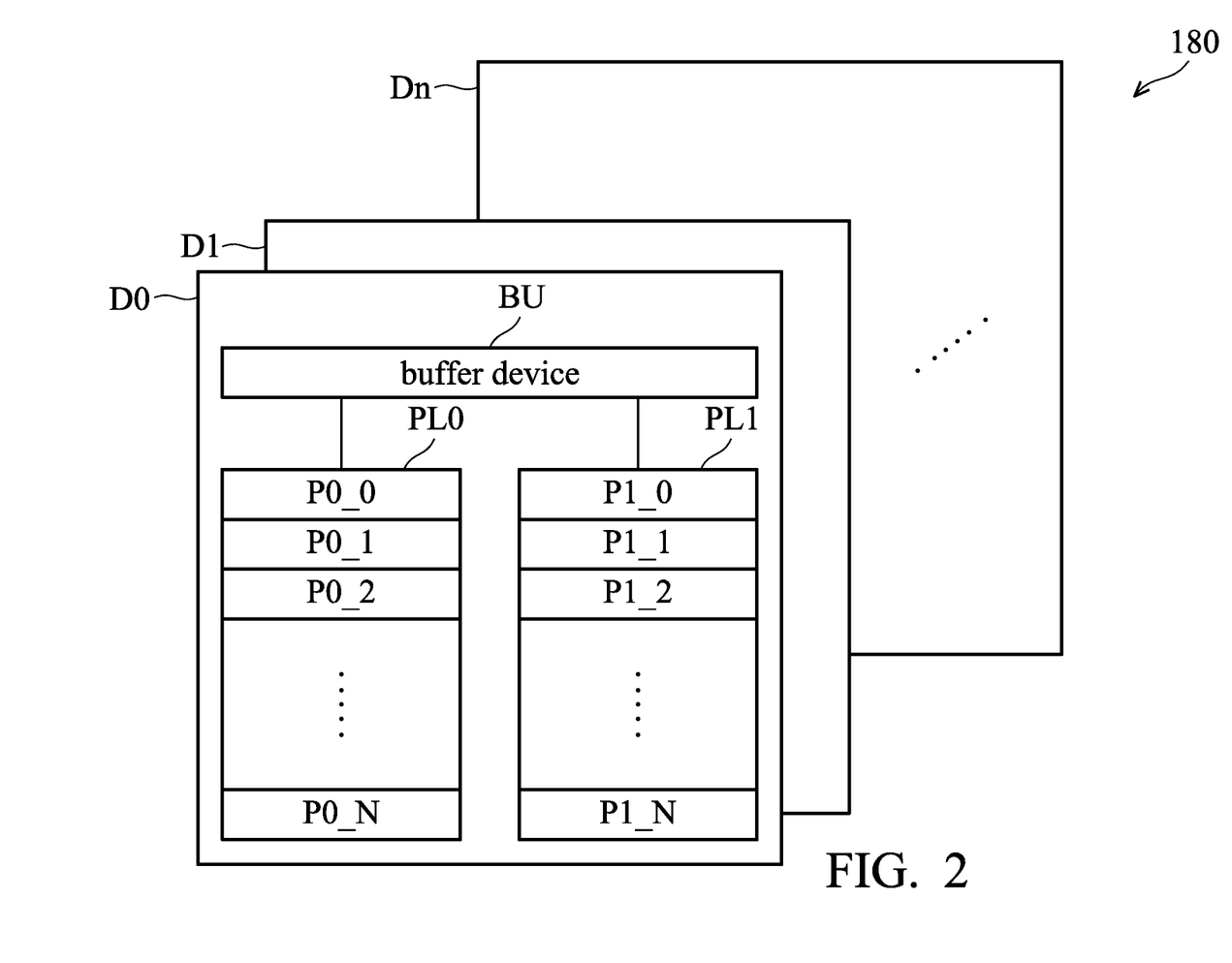
FIG. 2 is a schematic diagram illustrating an embodiment of dies of the present invention.

FIG. 1 is a schematic diagram illustrating an embodiment of an electronic system of the present invention. The electronic system 100 includes a host 120 and a data storage device 140. The data storage device 140 includes a flash memory 180 and a controller 160, and the data storage device 140 can operate in response to the commands of the host 120. The controller 160 includes a computing unit 162, a non-volatile memory 164 (ROM), a random access memory 166 (RAM) and an error correction engine 168. The non-volatile memory 164, the program code stored in the non-volatile memory 164 and data stored in the non-volatile memory 164 constitute firmware executed by the computing unit 162, and the controller 160 is configured to control the flash memory 180 based on the firmware. The program codes and parameters can be loaded into the random access memory 166 (RAM) for providing the controller 160 to execute. The error correction engine 168 is arranged to perform error correction on the data retrieved by the controller 160 and encode the data which is arranged to be written into the flash memory 180 to obtain the parity code of the data. The flash memory 180 includes a plurality of dies D0~DN, as shown in FIG. 2. Each of the dies D0~DN includes a buffer BU, a first memory plane PL0 and a second memory plane PL1. Each of the first memory plane PL0 and the second memory plane PL1 includes a plurality of physical pages P0~PN. It should be noted that, in this embodiment, each of the dies D0~DN includes a buffer BU arranged to buffer the data of the first memory plane PL0 and the second memory plane PL1, but it is not limited thereto. In other embodiment, each of the dies D0-DN may include two buffers, wherein the first buffer is arranged to buffer the data of the first memory plane PL0 and the second buffer is arranged to buffer the data of the second memory plane PL1.

In the production process of the flash memory, at least one column of memory cells may be damaged due to dust or issues with the mask, and the data of the damaged column cannot be successfully read, wherein the damaged column is referred to as a bad column. However, the number of bad columns in the different memory planes in a single die may be different. The more bad columns a memory plane has, the less usable memory space the memory plane has, wherein the amount of usable memory space affects the error correction capabilities. More specifically, a better error correction capability requires more memory space to store the longer parity code. It should be noted that the error correction is referred to as ECC.

Figure 3:
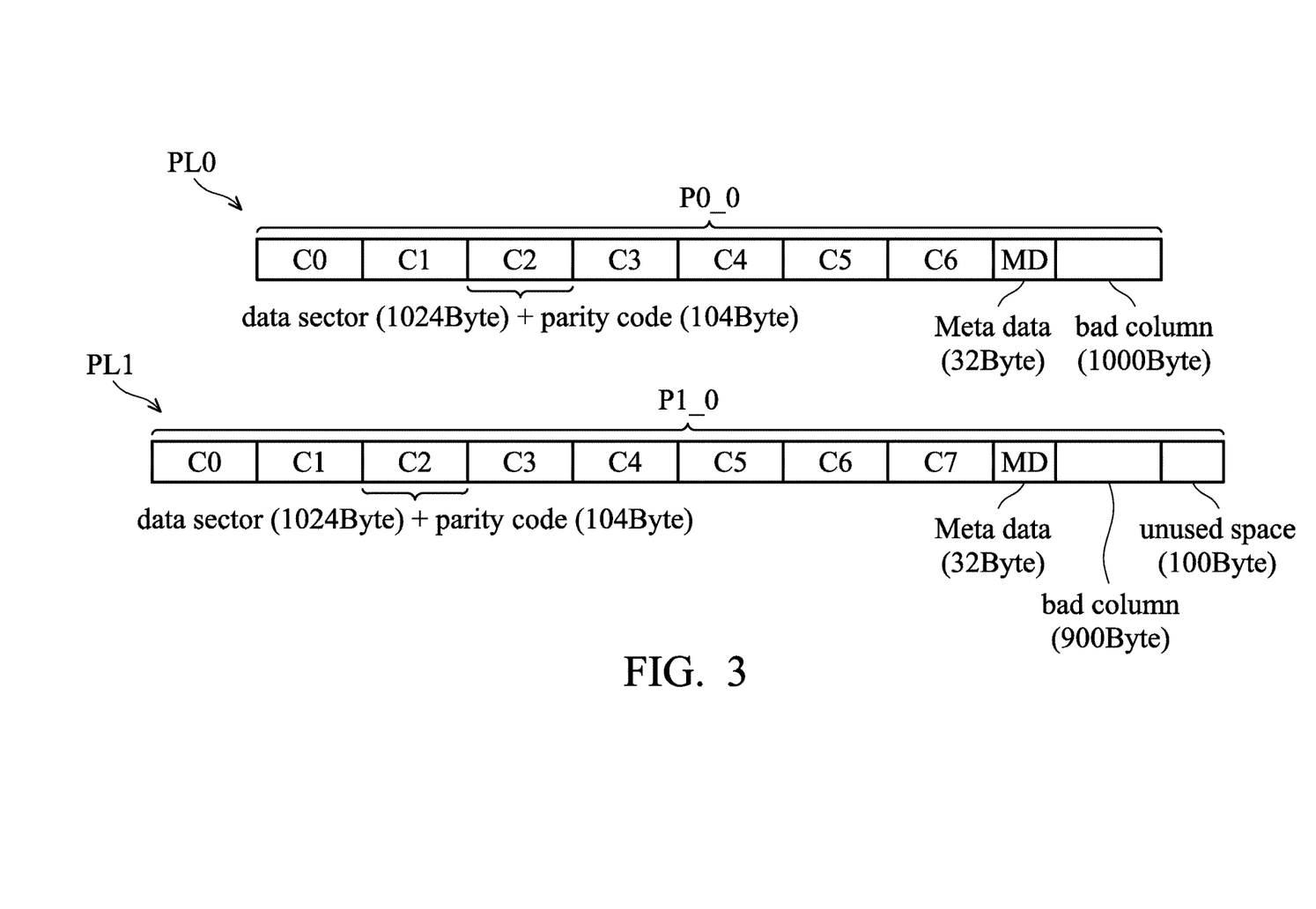
FIG. 3 is a schematic diagram illustrating an embodiment of physical pages of the present invention.

FIG. 3 is a schematic diagram illustrating an embodiment of physical pages of the present invention. In this embodiment, each of the physical pages of the first memory plane PL0 has 1000 Bytes of unusable memory space of bad columns and each of the physical pages of the second memory plane PL1 has 900 Bytes of unusable memory space of bad columns. Moreover, in this embodiment, the minimum reading unit of the flash memory 180 is physical page. Namely, each of the physical pages is the minimum reading unit which is known as page in the art. It should be noted that unusable memory space of the bad columns are shown in the end of the physical page P0 in FIG. 3, but actually the unusable memory of the bad columns are randomly distributed in the physical pages. In this embodiment, the product developer may design the first memory plane PL0 and the second memory plane PL1 to have the same ECC capability value, wherein the number of bad columns of the first memory plane PL0 is different from the number of bad columns of the second memory plane PL1, and the first memory plane PL0 and the second memory plane PL1 are in the same die. For example, in this embodiment, the ECC capability value of the first memory plane PL0 and the ECC capability value of the second memory plane PL1 are determined to be 59 Bits, wherein the ECC capability value which is 59 bits requires 104 Bytes of parity code. Taking the physical page P0 of the first memory plane PL0 and the physical page P0 of the second memory plane PL1 for example, each of the physical pages P0 of the first memory plane PL0 and the physical page P0 of the second memory plane PL1 has seven chunks C0~C6 and a meta data MD. Each of the chunks C0~C6 has a data sector and a parity code. The data sector is 1024 bytes long. The parity code is 104 bytes long. The Meta data MD is 32 bytes long. As shown in FIG. 3, although the number of bad columns of the second memory plane PL1 is less than the number of bad columns of the first memory plane PL0, the ECC capability of the second memory plane PL1 is the same as the first memory plane PL0 due to the pairing of the ECC capability of the first memory plane PL0. Therefore, 100 bytes of usable memory space of each of the physical pages of the second memory plane PL1 is wasted. It should be noted that the number of bad columns, the length of Meta data MD, the length of the data sector and the ECC capability above are an embodiment of the present invention, but it is not limited thereto. Each of the memory planes may have different bad columns based on different production environments. The number of chunks of a physical page, the ECC capability value and the length of the data sector can be determined by the product developer, wherein the length of the Meta data MD is determined by the ECC capability and the type of error correction.

Figure 4:
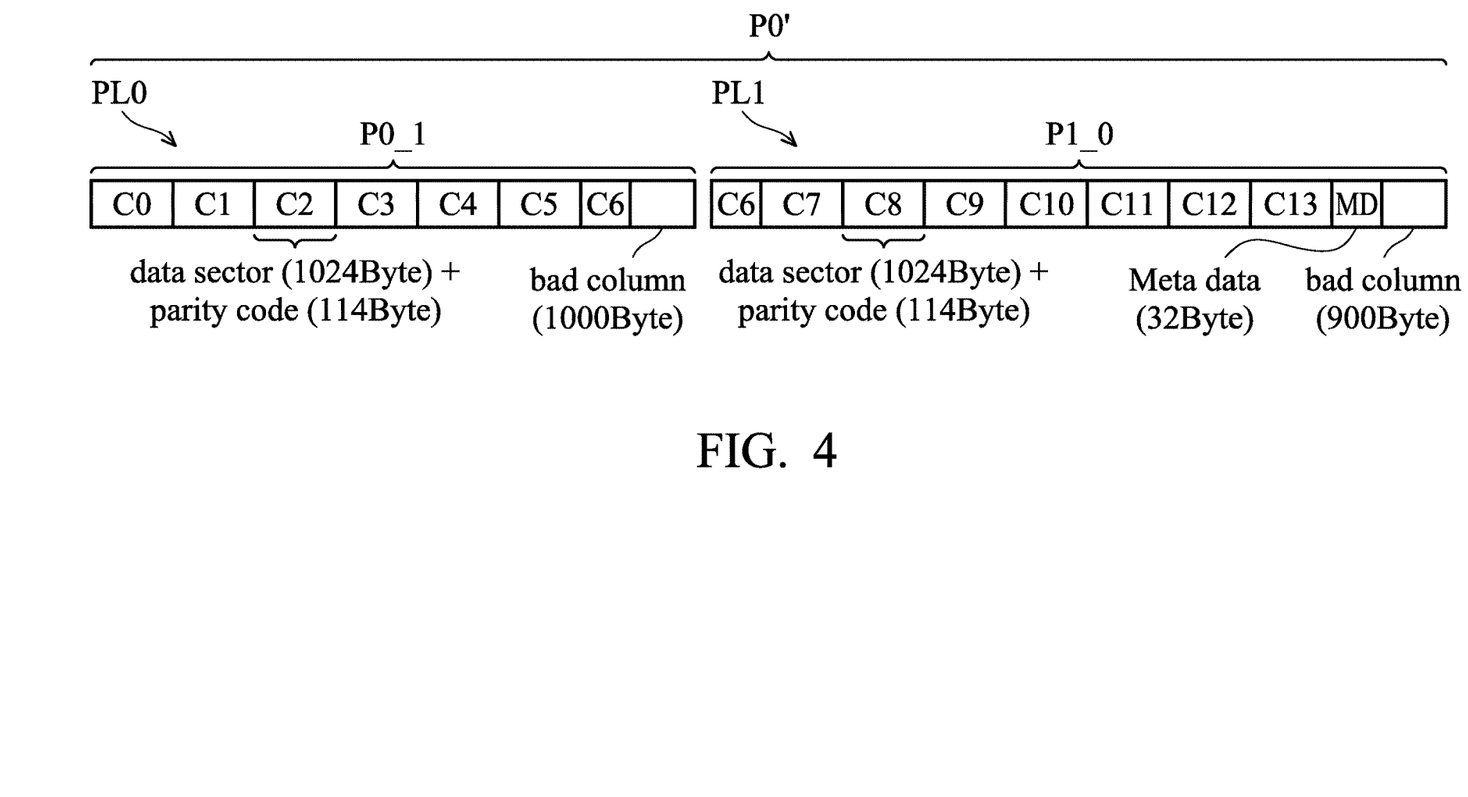
FIG. 4 is a schematic diagram illustrating another embodiment of physical pages of the present invention.
Figure 5:
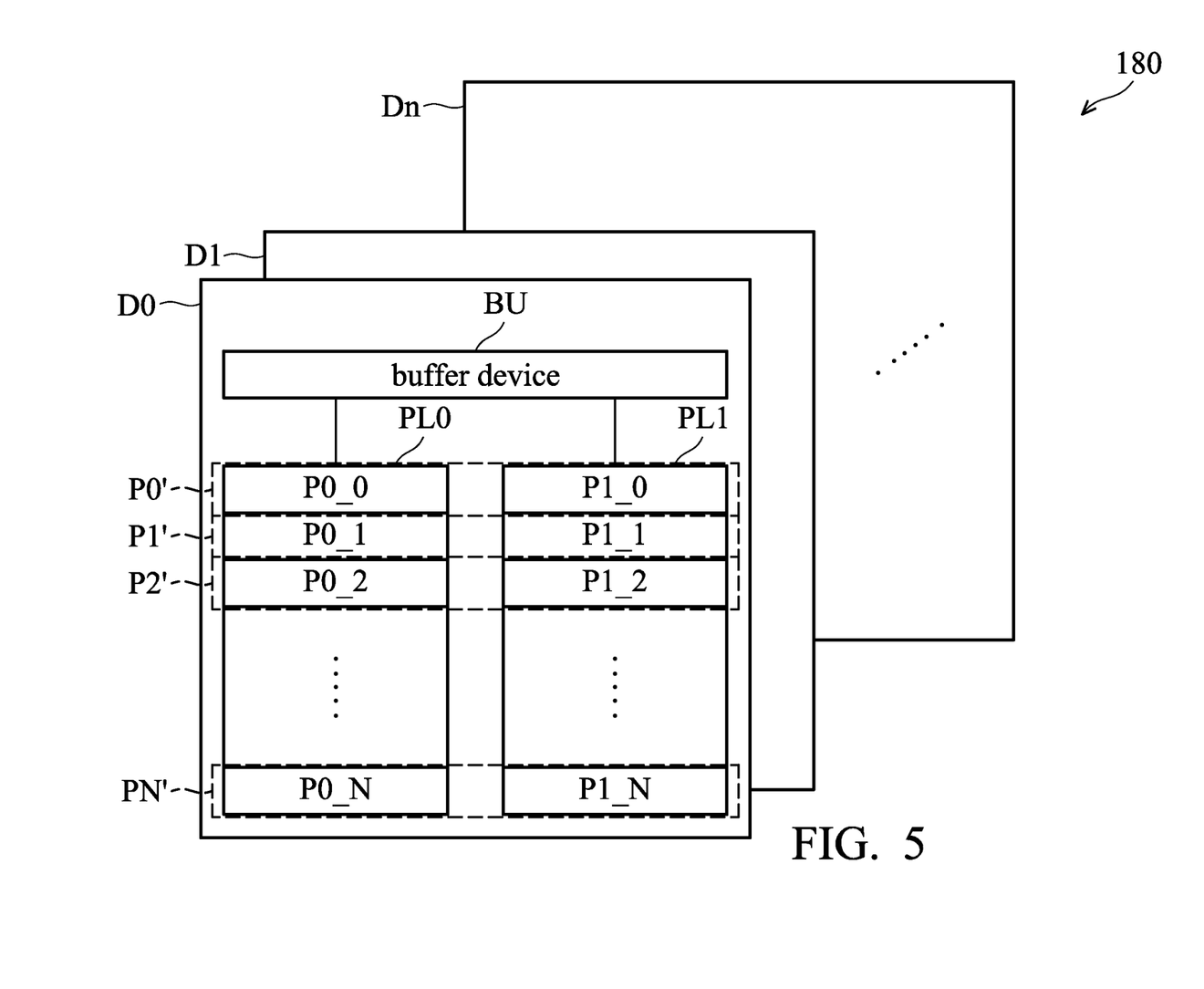
FIG. 5 is a schematic diagram illustrating another embodiment of dies of the present invention.

FIG. 4 is a schematic diagram illustrating another embodiment of physical pages of the present invention. In this embodiment, each of the physical pages of the first memory plane PL0 has 1000 Bytes of unusable memory space of bad columns, and each of the physical pages of the second memory plane PL1 has 900 Bytes of memory space of the bad columns. It should be noted that unusable memory space of the bad columns are shown in the end of the physical page P0 in FIG. 4, but actually the unusable memory of the bad columns are randomly distributed in the physical pages. Moreover, in this embodiment, the minimum reading unit of the flash memory 180 is one page, P0'~PN', as shown in FIG. 5. Namely, in this embodiment, the minimum reading unit (page) of the flash memory 180 is constituted by one of the physical pages of the first memory plane PL0 and one of the physical pages of the second memory plane PL1. In this embodiment, each of the pages P0'~PN' constituted by one of the physical pages of the first memory plane PL0 and one of the physical pages of the second memory plane PL1 has an ECC capability value. It should be noted that one of the physical pages P0_0~P0_N of the first memory plane PL0 and one the physical pages P1_0~P1_N of the second memory plane PL1 sequentially constitute pages P0'~PN', so that the wasted 100 bytes of memory space can be used to store the longer parity codes. Namely, the embodiment of FIG. 4 has more memory space to store the parity codes than the embodiment of FIG. 3. Furthermore, two of the physical pages of the embodiment of FIG. 4 only need one Meta data MD. Therefore, the ECC capability value of the minimum reading units (pages P0'~PN') of the embodiment of FIG. 4 is higher than the minimum reading units (physical pages) of the embodiment of FIG. 3. For example, in this embodiment, the ECC capability values of the pages P0'~PN' constituted by the first memory plane PL0 and the second memory plane PL1 are 65 bits, but it is not limited thereto. The ECC capability value which is 65 bits requires 114 bits of parity code. Taking the page P0' which is consisted by the physical page P0_0 of the first memory plane PL0 and the physical page P1_0 of the second memory plane PL1 for example, the page P0' has 14 chunks C0~C13 and a Meta data MD. Each of the chunks C0~C13 includes a data sector and a parity code. The length of the data sector is 1024 bytes, the length of the parity code is 114 bytes and the length of the Meta data MD is 32 bytes. It should be noted that the number of bad columns, the length of the Meta data MD, the length of data sector and the ECC capability value above is one of the embodiments of the present invention, but it is not limited thereto. Each of the memory planes may have different bad columns based on different production environments. The number of chunks of a page, the ECC capability value and the length of the data sector can be determined by the product developer, wherein the length of the Meta data MD is determined by the ECC capability and the type of error correction.

More specifically, in the embodiment of FIG. 4 and FIG. 5, the controller 160 retrieves the data of the first physical page P0_0 of the first memory plane PL0 and the data of the second physical page P1_0 of the second memory plane PL1 in response to a read command which is arranged to read a target page P0'. Moreover, the controller 160 is further configured to transmit the retrieved data of the first physical page P0_0 and the retrieved data of the second physical page P1_0 to the error correction engine 168, such that the error correction engine 168 can perform an error correction on the target page P0' based on the retrieved data of the first physical page P0_0 and the retrieved data of the second physical page P1_0. More specifically, the controller 160 is configured to sequentially transmit a plurality of chunk read commands to the flash memory 180 according to the read command to sequentially retrieve the data of the chunks C0~C13 of the target page P0' which is constituted by the first physical page P0_0 and the second physical page P1_0. It should be noted that each of the chunk read commands includes an address latch enable signal (ALE) and a command latch enable signal (CLE).

Moreover, in some embodiments, the controller 160 is further configured to retrieve the bytes of the first physical page P0_0 and the bytes of the second physical page P1_0 in response to two of the chunk read commands, respectively, to obtain the data of a chunk of the chunks. The controller 160 is further configured to transmit the data of the chunks C0~C13 retrieved by the chunk read commands to the error correction engine 168 to allow the error correction engine 168 performs the error correction on the retrieved data of the chunk C0~C13. For example, as shown in FIG. 4, a part of the data of chunk C6 is assigned to the second memory plane PL1 because the memory space of the first memory plane PL0 is full. Therefore, in this embodiment, the controller 160 is further configured to retrieve the data bytes stored in the first physical page P0_0 and the data bytes stored in the second physical page P1_0 in response to two of the chunk read commands to obtain the data of the chunk C6 of the chunks. Next, the controller 160 is further configured to transmit the data bytes of the first physical page P0_0 and the second physical page P1_0 retrieved by the chunk read commands to the error correction engine 168 to allow the error correction engine 168 performs the error correction on the retrieved data bytes of the chunk C6 of the first physical page P0_0 and the second physical page P1_0.

It should be noted that, in one embodiment, the flash memory 180 includes a mapping table arranged to store the mapping relationship of the physical pages and the corresponding pages P0'~PN'. When the data storage device 140 is started (power on), the controller 160 is configured to load the mapping table into the random access memory 166, so that the addresses of target pages can be transferred to the addresses of the corresponding physical pages when a read command or a write command is received, and access the flash memory 180 according to the transferred address. In another embodiment, the controller 160 further includes a page conversion circuit. The page conversion circuit is a hardware circuit arranged to combine the retrieved data of the physical pages P0_0~P0_N of the first memory plane PL0 and the data of the physical pages P1_0~P1_N of the second memory plane PL1 into the data of the pages P0'~PN' and provide the combined data corresponding to the pages P0'~PN' to the controller 160 for reading and writing, but it is not limited thereto.

Figure 6:
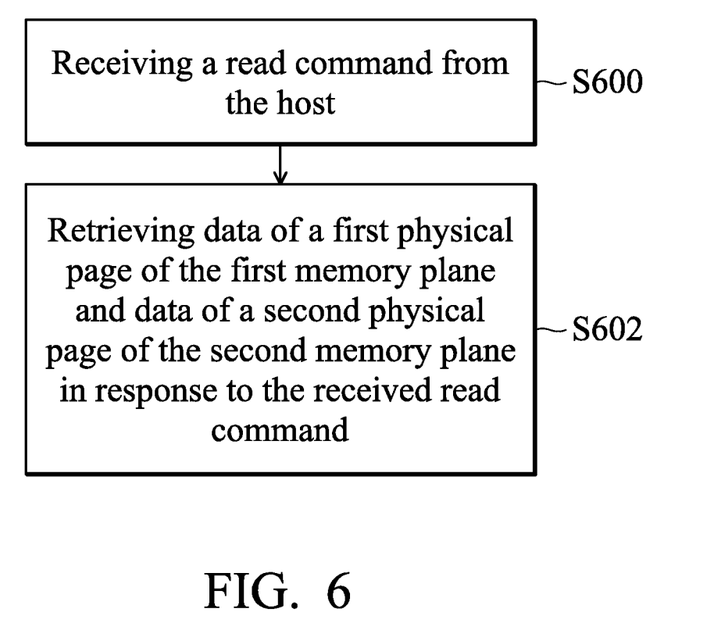
FIG. 6 is a flowchart of a data retrieval method according to an embodiment of the present invention.

FIG. 6 is a flowchart of a data retrieval method according to an embodiment of the present invention. The data retrieval method is applied in the electronic system 100 of FIGS. 1~5. The process starts at step S600.

In step S600, the controller 160 receives a read command from the host 120, wherein the read command is arranged read a target page.

Next, in step S602, the controller 160 retrieves data of a first physical page of the first memory plane PL0 and data of a second physical page of the second memory plane PL1 in response to the received read command. More specifically, the controller 160 is configured to sequentially transmit a plurality of chunk read commands to the flash memory 180 according to the read command to sequentially retrieve the data of a plurality of chunks C0~C13 of the target page which is constituted by the first physical page P0_0 and the second physical page P1_0. It should be noted that each of the chunk read commands includes an address latch enable signal (ALE) and a command latch enable signal (CLE). Moreover, in some embodiment, the controller 160 is further configured to retrieve the data bytes of the first physical page P0_0 and the data bytes of the second physical page P1_0 in response to two of the chunk read commands to obtain the data of one of the chunks. For example, as shown in FIG. 4, a part of data of chunk C6 is assign to the second memory plane PL1 because the memory space of the first memory plane PL0 is full. Therefore, in this embodiment, the controller 160 is further configured to retrieve the data bytes of the first physical page P0_0 and the data bytes of the second physical page P1_0 in response to two of the chunk read commands to obtain the data of the chunk C6 of the chunks. The process ends at step S602.

Figure 7:
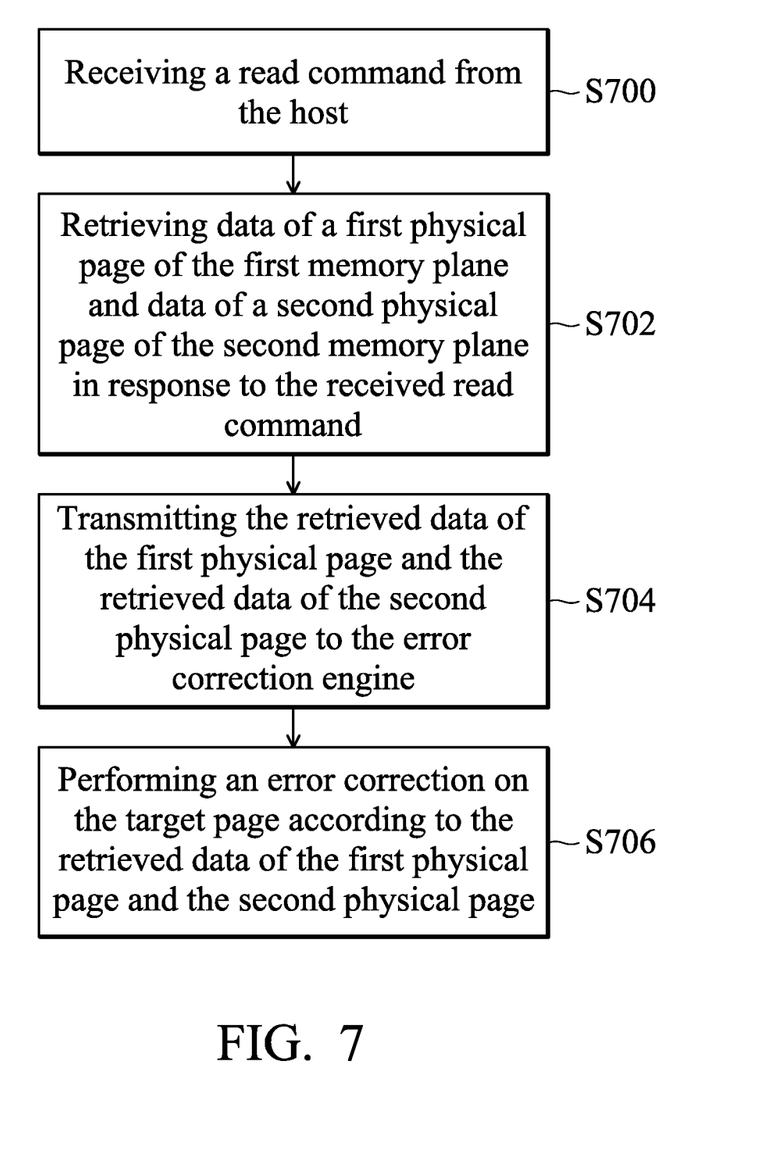
FIG. 7 is a flowchart of a data retrieval method according to another embodiment of the present invention.

FIG. 7 is a flowchart of a data retrieval method according to another embodiment of the present invention. The data retrieval method is applied in the electronic system 100 of FIGS. 1~5. The process starts at step S700. It should be noted that, steps S700~S702 are similar to steps S600~S602. Therefore, the detail of steps S700~S702 can be referred to in FIG. 7.

In step S704, the controller 160 is further configured to transmit the retrieved data of the first physical page P0_0 and the retrieved data of the second physical page P1_0 to the error correction engine 168. More specifically, the controller 160 is configured to transmit the data of the chunks retrieved by the chunk read commands to the error correction engine 168. In the embodiment of FIG. 4, the controller 160 transmits the retrieved data bytes of the first physical page P0_0 and the second physical page P1_0 to the error correction engine 168 after the controller 160 respectively retrieved the bytes of the first physical page P0_0 and the second physical page P1_0 according to a first chunk read command and a second chunk read command.

In step S706, the error correction engine 168 performs an error correction on the target page according to the retrieved data of the first physical page P0_0 and the second physical page P1_0. More specifically, the error correction engine 168 is configured to perform the error correction according to the retrieved data of chunks. In the embodiment of FIG. 4, the error correction engine 168 is configured to perform the error correction on the chunk C6 according to the retrieved bytes of the first physical page P0_0 and the second physical page P1_0. The process ends at step S706.

The data storage device 140 and the data retrieval method can combine the pages of two memory planes. Namely, the minimum reading unit of the data storage device 140 is a page constituted by two physical pages.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
 a flash memory, comprising a plurality of dies, and each of the dies comprises a first memory plane and a second memory plane, wherein each of the first memory plane and the second memory plane comprises a plurality of physical pages; and a controller, determining that one of the physical pages of the first memory plane and one of the physical pages of the second memory plane constitute a minimum reading unit, wherein the controller retrieves data of a first physical page of the first memory plane and data of a second physical page of the second memory plane in response to a read command which is arranged to read a target page.

2. The data storage device as claimed in claim 1, wherein the controller further comprises an error correction engine, and the controller further transmits the retrieved data of the first physical page and the retrieved data of the second physical page to the error correction engine to allow the error correction engine to perform an error correction on the target page according to the retrieved data of the first physical page and the retrieved data of the second physical page.

3. The data storage device as claimed in claim 2, wherein the controller sequentially transmits a plurality of chunk read commands to the flash memory in response to the read command to retrieved a plurality of chunks of the target page which is constituted by the first physical page and the second physical page, wherein the controller retrieves a plurality of bytes of the first physical page and a plurality of bytes of the second physical page by two of the chunk read commands to obtain a first chunk of the chunks.

4. The data storage device as claimed in claim 3, wherein each of the chunks comprises a data sector and a parity code arranged to correct the data sector.

5. The data storage device as claimed in claim 3, wherein the controller transmits the retrieved bytes of the first physical page and the second physical page retrieved by the two chunk read command to the error correction engine to allow the error correction engine perform the error correction on the first chunk according to the retrieved bytes of the first physical page and the second physical page.

6. The data storage device as claimed in claim 3, wherein each of the chunk read command comprises an address latch enable signal and a command latch enable signal.

7. A data retrieval method, applied to a flash memory, wherein the flash memory comprises a plurality of dies, each of the dies comprises a first memory plane and a second memory plane, each of the first memory plane and the second memory plane comprises a plurality of physical pages, and the data retrieval method comprises:

determining, by a controller, that one of the physical pages of the first memory plane and one of the physical pages of the second memory plane constitute a minimum reading unit;

receiving, by the controller, a read command from a host, wherein the read command is arranged to read a target page; and retrieving, by the controller, data of a first physical page of the first memory plane and data of a second physical page of the second memory plane in response to the read command.

8. The data retrieval method as claimed in claim 7, further comprising:

transmitting the retrieved data of the first physical page and the retrieved data of the second physical page to an error correction engine; and performing an error correction on the target page according to the retrieved data of the first physical page and the retrieved data of the second physical page.

9. The data retrieval method as claimed in claim 8, wherein the step of retrieving the data of the first physical page of the first memory plane and the data of the second physical page of the second memory plane in response to the read command further comprises:

sequentially transmitting a plurality of chunk read commands to the flash memory according to the read command to sequentially retrieve a plurality chunks of the target page which is constituted by the first physical page and the second physical page, wherein two of the chunk read commands are respectively arranged to retrieve a plurality bytes of the first physical page and a plurality bytes of the second physical page to obtain a first chunk of the chunks.

10. The data retrieval method as claimed in claim 9, wherein each of the chunks comprises a data sector and a parity code arranged to correct the data sector.

11. The data retrieval method as claimed in claim 9, further comprising:

transmitting the bytes of the first physical page and the second physical page retrieved by the two of the chunk read commands to the error correction engine; and performing the error correction on the first chunk by the error correction engine according to the retrieved bytes of the first physical page and the second physical page.

12. The data retrieval method as claimed in claim 9, wherein each of the chunk read commands comprises an address latch enable signal and a command latch enable signal.

* * * * *